MODULATOR CIRCUIT

Filed Sept. 3, 1953

INVENTORS
Louis H. Rohr
William L. Firestone
BY
Foorman L. Mueller
Atty

March 17, 1959 L. H. ROHR ET AL 2,878,452

MODULATOR CIRCUIT

Filed Sept. 3, 1953 2 Sheets-Sheet 2

INVENTORS
Louis H. Rohr
William L. Firestone
BY
Norman L. Mueller
Atty.

2,878,452
Patented Mar. 17, 1959

1

2,878,452

MODULATOR CIRCUIT

Louis H. Rohr, Winnetka, and William L. Firestone, Chicago, Ill., assignors to Motorola, Inc., Chicago, Ill., a corporation of Illinois Application September 3, 1953, Serial No. 378,262

14 Claims. (Cl. 332—26)

This invention relates generally to circuits including piezo-electric crystal units for controlling the frequency response thereof, and more particularly to crystal oscillator circuits wherein the frequency of the circuit is varied by applying physical pressure to the crystal to change a dimension thereof.

Piezo-electric crystals made of quartz and other materials have been used in electrical circuits as frequency controlling elements. Because the resonance characteristics of such crystals are very sharp, they have been used to provide very accurate control. To hold the output frequency of transmitters or other radio circuits very precisely, crystals have been used as the frequency controlling elements for oscillator circuits which generate the waves radiated by such transmitters.

In many instances wherein oscillations are controlled by crystals, it is desired to modulate the frequency of the oscillations. This is required in frequency modulation radio transmitters wherein crystal control is required to hold the center frequency very accurately and large frequency deviations are required to provide good signal reception. Although circuits have been provided wherein the effective frequency of crystal circuits can be changed, these have not been entirely satisfactory, because they have been relatively complicated, because the change in frequency which can be obtained is limited, and because the change in frequency may destroy the desired frequency characteristics of the crystal.

It is therefore an object of the present invention to provide an improved crystal controlled modulated oscillator system.

A further object of the invention is to provide a modulating system wherein the frequency characteristics of a piezo-electric crystal are changed by applying mechanical pressure to the crystal to produce stresses and strains therein.

A still further object of the invention is to provide a direct frequency modulated wave from a crystal oscillator by physically compressing and/or stretching the crystal at the modulating frequency so that the oscillations thereof will be modulated thereby.

A feature of the invention is the provision of a crystal modulating circuit wherein the crystal is held in a holder and is subjected to forces applied at a modulating rate for producing slight changes in a dimension of the crystal causing stresses and strains therein and thereby changing the frequency of oscillations produced thereby. The force may be applied by any mechanical driving source operating at a low frequency such as an electromechanical device operating at audio frequencies.

A further feature of this invention is the provision of a frequency modulating structure including a first piezo-electric oscillating crystal adapted to oscillate at a frequency to produce a carrier wave, and a second audio crystal which responds to low frequency voltages applied thereto, with the crystals being in engagement so that the carrier wave producing crystal is compressed and/or stretched by the audio crystal to thereby modulate the

2 frequency of oscillations produced by the carrier wave producing crystal.

Another feature of the invention is the provision of a simplified frequency modulated transmitter wherein an oscillator controlling crystal is coupled to an electromechanical vibrating source so that movement of the source is applied to the oscillator crystal to change the frequency of oscillations thereof. As high deviations may be produced by crystals operating at very high frequencies, the over-all circuit is simplified and a frequency modulation transmitter may be constructed by using a single oscillator tube and a single output tube.

Further objects, features and the attending advantages of the invention will be apparent from a consideration of the following description when taken in connection with the accompanying drawings in which.

In practicing the invention there is provided an electronic circuit wherein a piezo-electric crystal is used to affect the frequency response of the circuit. The crystal is provided in a holder wherein mechanical pressure is applied to deform the crystal and thereby change the frequency characteristics thereof. The circuit may be an oscillator circuit wherein dynamically varying forces are applied to the crystal to cause frequency modulation of the oscillations produced by the circuit. The forces may be applied by various electromechanical devices which reproduce the modulating frequency desired. For audio use a crystal which is deformed in accordance with an audio frequency variation in voltage may be used to exert pressure on the oscillating crystal for controlling the frequency of oscillations. Other devices such as solenoid, moving coil, or rotatable armature type devices may also be used for providing compression and/or stretching of the oscillating crystal. By exerting heavy forces on a crystal operating at a harmonic mode, relatively wide deviations at relatively high operating frequencies can be provided. This permits the use of extremely simple frequency modulation transmitter circuits, and circuits requiring only two vacuum tubes are entirely practical. In such case one tube operates as the oscillator and the other as the output. To operate at higher frequencies, simple frequency multiplication circuits may be used, and to operate at higher powers, additional amplifiers may be provided.

Figure 1:
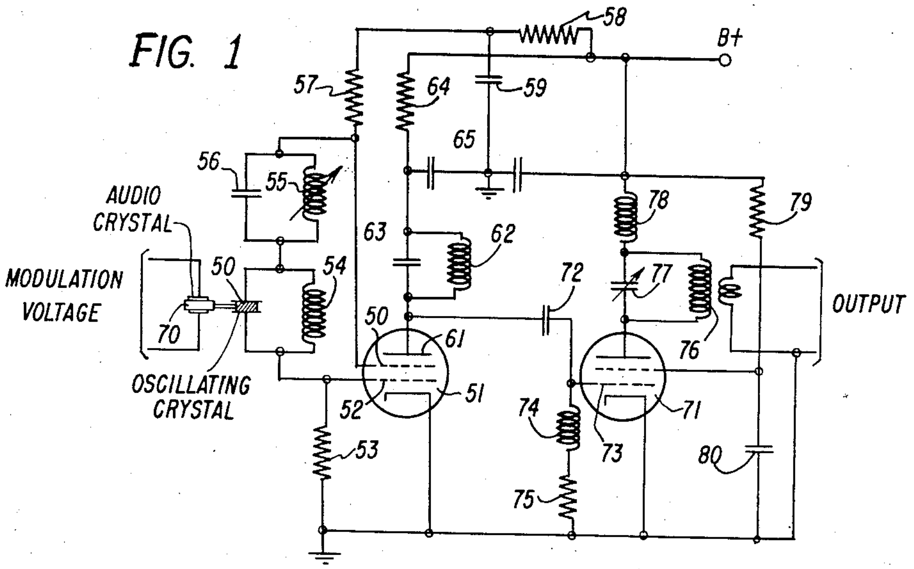
Fig. 1 is a circuit for a frequency modulated radio transmitter embodying a crystal circuit in accordance with the invention.

Reference is now made to Fig. 1 wherein the use of the change in frequency resulting from deformation of a crystal is applied to an oscillator circuit to provide frequency modulation thereof. In this system the crystal 50 controls the frequency of oscillation of an oscillator circuit including the tube 51. The crystal 50 is connected in the circuit of the control grid 52 of the tube 51, the grid being connected to ground through grid leak resistor 53. Connected across the crystal 50 is a neutralizing inductance 54, and in series therewith is a tuned circuit formed by variable inductance 55 and condenser 56. This circuit selects the harmonic frequency of the crystal at which oscillations will take place. This circuit is connected to B+ through resistors 57 and 58. Operating potential is also provided for the screen grid 60 of the tube 51 through the resistors 57 and 58. The plate 61 is connected to the tuned circuit formed by inductance 62 and condenser 63, and is connected through resistor 64 to B+. This circuit may be tuned to multiply the frequency of the oscillator. Condensers 59 and 65 provide bypasses for the power supply.

The output of the oscillator will follow the frequency response of the crystal 50. As the resonant frequency of the crystal 50 will be varied when it is compressed and/or stretched, the frequency of oscillation of the circuit will also be varied. This action may be produced by a second crystal 70 which is of the type responding to low frequencies such as audio frequencies which may be used to modulate the oscillator. The modulating voltage is applied to plates connected to either side of the crystal 70. The crystal 70 may be made of barium titanate or other material which provides large deviations at low frequencies and requires little power.

In Fig. 1 the oscillator circuit is illustrated as connected to an output stage including the tube 71. Oscillations are applied to the tube 71 from the plate of the tube 51 through coupling condenser 72 connected to the grid 73 of the tube 71. The grid is connected to ground through the series circuit including inductor 74 and resistor 75. The output from the tube 71 is derived from the plate thereof which is connected to transformer 76. The primary of the transformer 77 is tuned by variable condenser 77 and this circuit is connected through inductance 78 to +B to provide operating potential to the tube 71. Operating potential is also applied through resistor 79 to the screen grid of the tube, being bypassed by condenser 80. The output of the system is derived from the secondary winding of the transformer 76.

The simple circuit of Fig. 1 actually forms a complete frequency modulation transmitter. This is possible because the frequency deviation produced by compressing the crystal is sufficient so that multiplication of the deviation is not required. The two tube circuit provides operation generally equivalent to seven tube circuits now commercially used. The transmitter frequency is limited by the maximum frequency of the crystal, although as stated above, the circuit may be tuned to a harmonic of the crystal frequency rather than the fundamental. It is obvious that if higher frequencies are required, one or more frequency multiplier stages may be provided between the tubes 51 and 71 to increase the frequency. The power output is limited by the capacity of the tube 71 but if greater power is required, additional tubes can be used in a well-known manner.

Figure 2:
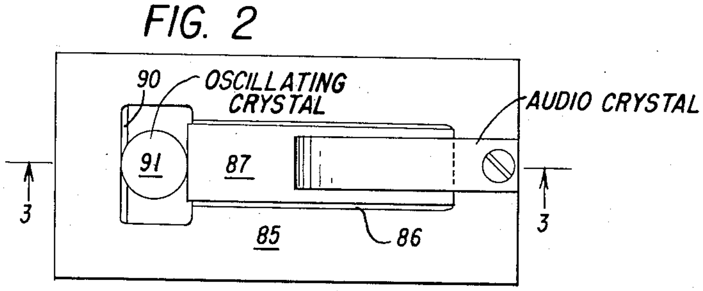
Fig. 2 is a top view of one embodiment of a crystal holder including an oscillator crystal engaging an audio crystal.
Figures 3, 4:
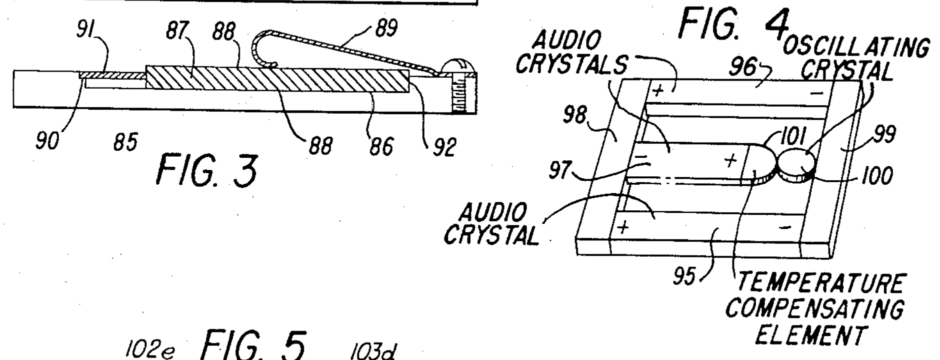
Fig. 3 is a cross section view along the lines 3—3 of Fig. 2.
Figs. 4 and 5 illustrate other embodiments of crystal units including oscillator and audio crystals.

Reference is now made to Figs. 2 and 3 wherein there is illustrated one crystal holder structure for holding both the oscillating quartz crystal and the audio driving crystal for a system as shown in Fig. 1. This structure includes a base 85 having a recess 86 therein for receiving the audio crystal 87. This may be a ceramic crystal having conducting coatings 88 on the top and bottom surfaces thereof. Connection may be made to the conducting surface on the top through the spring 89 which holds the crystal against the base 85. Connection can be made to the lower coating in various well-known manners. The base 85 includes a ledge 90 for supporting one end of the oscillating crystal 91 and which is in the form of a flat plate. This crystal likewise has conducting electrodes on the opposite sides thereof. The crystal 91 is cemented to the ledge 90, and is also cemented at the opposite edge to the ceramic crystal 87. The ceramic crystal 87 is likewise secured at the remote end 92 thereof to the base 85. Accordingly, as the ceramic crystal 87 expands and contracts in response to the audio modulating voltage applied across the electrodes thereof, the crystal 91 will be compressed and stretched in opposite phase across opposite edges thereof. This compression and stretching of the crystal will change the resonant frequency of oscillation thereof to thereby modulate the oscillations produced by the crystal in accordance with the audio modulation applied to the ceramic crystal 87.

In Fig. 4 there is shown a second embodiment of a crystal modulating structure. Three ceramic audio crystal elements 95, 96 and 97 are provided. The elements 95, 96 and 97 are secured together at one end by a rigid end plate 98, and at the other end by end plate 99 which engages the ceramic crystal elements 95 and 96 and the oscillator crystal 100. A nosepiece 101 may be provided between the ceramic crystal element 97 and the oscillating crystal 100. The ceramic elements 95 and 96 are polarized in the same sense and the element 97 is polarized in opposite sense. Therefore, as the modulating frequency applied to the ceramic elements varies in one direction, the effect on the oscillating crystal will be additive to either compress or stretch the same. Accordingly, relatively large effects can be produced in a structure which is relatively short because of the reverse configuration and the additive effects.

The structure of Fig. 4 has the further advantage that the temperature variations of the elements 95, 96 and 97 will tend to balance each other out and variations will apply only to the short difference in lengths of the elements. The difference between the temperature coefficient of the ceramic crystal elements and of the oscillating crystal can be compensated for by proper choice of the nosepiece 101. By selecting a material for the nosepiece having a proper coefficient of expansion, the results of temperature changes can be completely balanced out so that there will be no change in the frequency resulting from change in temperature.

The structure of Fig. 4 may be further simplified by making parts 95, 96, 97, 98 and 99 out of a single ceramic piece polarized in one direction. However, no metal electrode platings would be provided on the parts of the complete unit indicated on Fig. 4 as 98 and 99 so that these parts will not expand and contract with the applied modulation. Furthermore, since the pieces shown on Fig. 4 as 95, 96, and 97 are all polarized in an identical manner, and since they are made from a common piece of ceramic, it is necessary to apply the modulation to elements 96 and 95 with a given polarity and to reverse the polarity of the modulation applied to the piece designed as part 97 in Fig. 4. This reversal of applied modulation is fully equivalent to using parts 96 and 95 with one polarization and part 97 with the opposite polarization as previously discussed. As no metal platings would be provided over the parts designed on Fig. 4 as 98 and 99, the platings on parts 95, 96 and 97 would be separate from each other making it possible to apply voltage of opposite polarity to part 97 as compared with parts 95 and 96.

The structure of Fig. 4 may alternatively be modified by molding the parts 95, 96, 97, 98 and 99 as a single ceramic member with the various parts polarized in the different directions. Continuous electrode plates could be used having the same voltage applied, with the different polarization causing movements which add up to provide the desired action.

Figure 5:
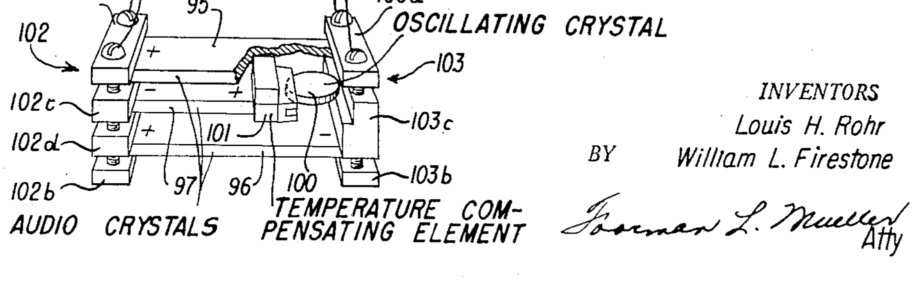

A modified structural embodiment of the ceramic modulator is shown in Fig. 5. In this figure the ceramic elements 95, 96 and 97 are stacked vertically rather than being positioned in a plane. The elements are secured together at one end by the clamp structure 102 which includes the top and bottom plates 102*a* and 102*b* and the spacer plates 102*c* and 102*d*, all secured together by bolts 102*e*. At the other end the ceramic elements 95 and 96 are secured to the end structure 103 which includes the top and bottom plates **103*a* and 103*b* and the spacer 103*c*, which are secured together by bolts 103*d*. The crystal 100 is secured in a slot in the nosepiece 101 and rests on a ledge on the spacer 103*c*. The crystal is secured to these parts as by cementing so that it will be compressed and stretched by action of the ceramic elements 95, 96 and 97. As in the structure of Fig. 4 the nosepiece 101** may be made of a material having a temperature coefficient of expansion such that the temperature effects of the overall structure balance out.

Figures 6, 7, 8, 9, 10:
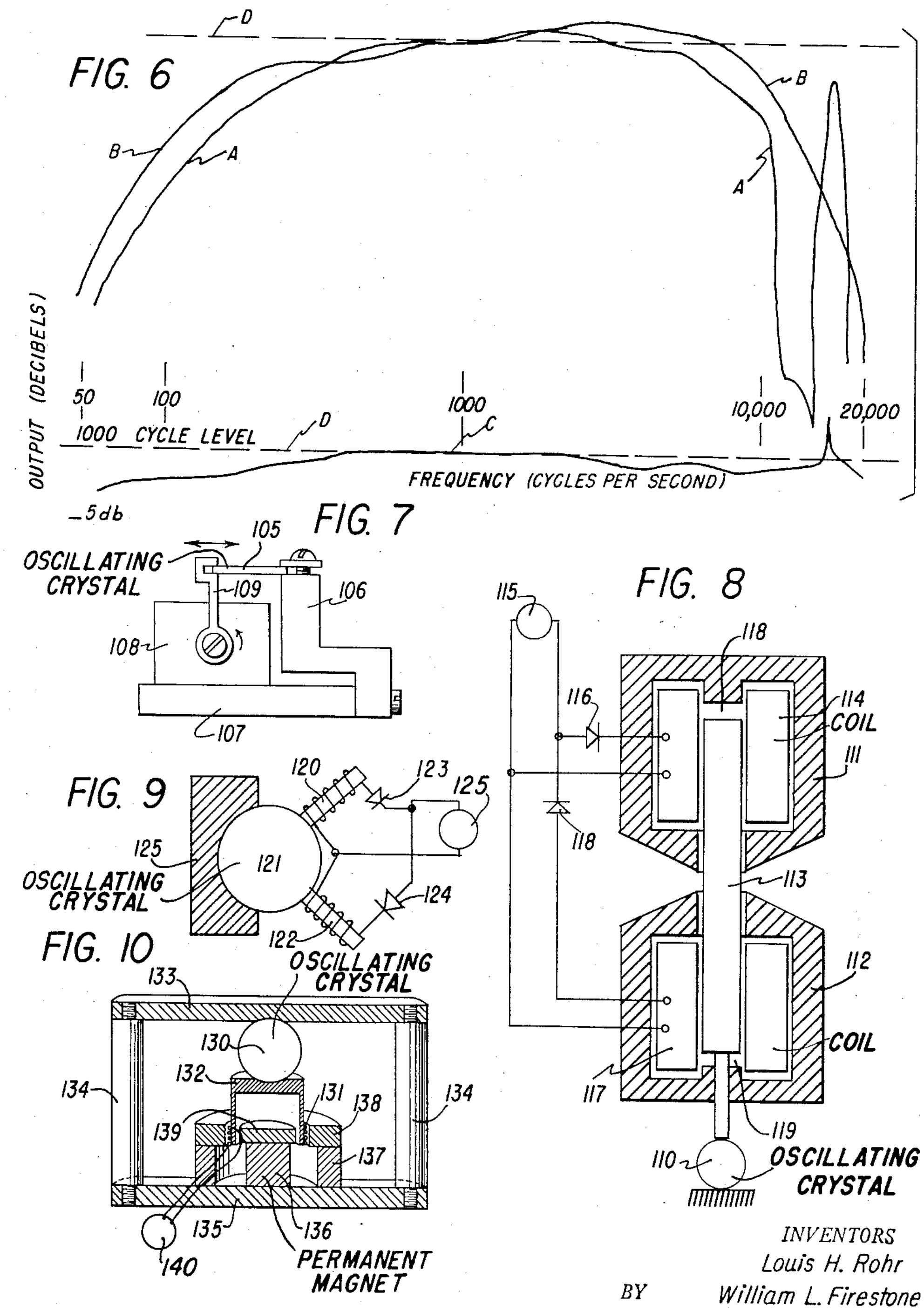
Fig. 6 illustrates the characteristic of an oscillator circuit in accordance with Fig. 1.
Fig. 7 illustrates a mechanical crystal modulator structure utilizing an electromechanical driving unit of the rotary type.
Fig. 8 illustrates a crystal modulator structure of the solenoid type.
Fig. 9 illustrates a modification of the structure of Fig. 8.
Fig. 10 illustrates a crystal modulator structure of the moving coil type.

In Fig. 6 there is illustrated the characteristics of the modulator in accordance with the invention. Curve A shows the output of a receiver for modulating frequencies varying from 50 cycles per second to 20,000 cycles per second, when the invention is used. The curves are shown varying from the dotted line D which represents the output at 1,000 cycles per second. The curve A shows the output of a receiver which is receiving a signal from a transmitter in accordance with the invention. Curve B shows the output of the same receiver in response to signals fed thereto from a calibrated signal generator. Accordingly, it will be noted that the main variation in the curve A results from the characteristics of the receiver, not from variations in the modulation.

Curve C shows the difference of curves A and B and is an indication of the variation in the modulation due to the modulator alone and therefore independent of receiver characteristics. This curve shows variations from the level at 1,000 cycles over the range from 50 cycles to 20,000 cycles. It is noted that this variation is less than three decibels on either side of the 1,000 cycle level throughout this wide range of modulating frequencies. The response of such a modulating system is essentially flat for all frequencies except at points where mechanical resonances occur. At such points the response will normally increase slightly.

In Figs. 7 to 10 inclusive there are illustrated other structural embodiments for providing direct modulation of a crystal oscillator by compressing and/or stretching the crystal itself. In Fig. 7 the crystal 105 is rigidly secured to an arm 106 mounted on a base 107. Mounted on the base is a rotatable armature structure 108 which may be generally similar to a phonograph record cutting head. This structure provides rotary movement of the arm 109 in response to the application of modulating signals thereto. The rotary movement of the arm 109 results in compressing and stretching of the crystal 105 to change the resonant frequency of the crystal. Such structures have been found to operate satisfactorily to change the frequency of the crystal.

In Fig. 8 there is illustrated a structure of the solenoid type which may be used to compress and stretch the crystal 110. Actually the structure includes two solenoid units, the upper unit 111 and the lower unit 112, with a single sliding piston 113 cooperating with both units. The unit 111 includes a coil 114 which is fed from a signal source 115 through rectifier 116. The lower unit 112 similarly has a coil 117 fed from the source 115 through the rectifier 118. When positive half cycles of energy are fed to the coil 114, the piston 113 will move upwardly and tend to close the air gap 119. This will stretch the crystal 110. When opposite half cycles of energy are applied, the effect of the coil 117 is to cause the piston 113 to move downward and tend to close the air gap 119. This will compress the crystal 110. Such a structure has been found to provide very high efficiency and may be constructed to have the power required to provide wide deviation of the crystal frequency. By operating the unit at lower efficiency, the modulator has very high fidelity.

Although it is possible to provide frequency variations both plus and minus by compressing and stretching a crystal along one axis within the crystal plate and parallel to a major surface thereof, as has been described, it may be desirable in certain applications to provide frequency variations plus and minus by compression of the crystal only. This can be accomplished by a system as shown in Fig. 9 wherein a first electromechanical driving unit 120 may operate to compress the crystal blank 121 along the X axis and a second electromechanical driving unit 122 may compress the crystal blank 121 along the Z axis. It has been found that crystals are less sensitive to deformation along the Z axis and therefore greater frequency deviation takes place by compressing or stretching along the X axis.

The units 120 and 122 may be energized from source 125 through rectifiers 123 and 124 in the same manner as in Fig. 8 so that each is energized during the part of each cycle of one polarity. The crystal blank may be held against a base 125 which permits compression along the two axes X and Z at right angles. Compression of the crystal at points intermediate the X and Z axes around the arc will provide a gradual change from positive frequency changes through zero to negative frequency changes. Accordingly, a balanced push-pull arrangement can be provided by shifting the unit 120 away from the X axis so that the sensitivity thereof is reduced and the sensitivity of the two units 120 and 122 may be made substantially the same. Alternatively, by driving the unit 120 proportionately harder than the unit 122, the deviation may be equalized.

In Fig. 10 there is shown a further structure for compressing and stretching the crystal 130. This structure is similar to a moving coil loud speaker structure with the moving coil 131 being connected through the member 132 to the crystal 130. The opposite edge of the crystal is rigidly held by a crossbar 133 connected through posts 134 to base 135. Supported on the base 135 is a magnetic structure which may include a permanent magnet 136 and soft iron pole pieces 137, 138 and 139. The base member 135 must also be made of magnetic material in order to complete the magnetic circuit. Application of signal current such as audio waves from a source 140 to the coil 131 will cause the coil to oscillate in the air gap formed between the pole pieces 138 and 139. This will compress and stretch the crystal 130 at the modulating frequency to thereby vary the resonant frequency of the crystal and modulate oscillations which may be produced in a circuit including the crystal.

It is therefore seen that a system has been provided for changing the resonant frequency of a crystal by mechanical deformation thereof. Although the actual changes in dimensions of the crystal may be quite small, stresses and strains are set up therein which change the frequency response thereof. The system may provide very wide deviation of the frequency when the forces are applied along the proper axis of the crystal. Such deviations may be utilized both as static changes to provide an adjustment of frequency and as dynamic changes to provide modulation of the frequency.

The use of the crystal wherein the frequency is controlled by a varying mechanical pressure is of great importance in frequency modulation systems. In the past only slight frequency deviation has been obtainable in crystal oscillator circuits and it has therefore been necessary to multiply this deviation to obtain the deviation required for good frequency modulation transmission. In the present system wide deviation can be obtained in the first instance so that the multiplication of the deviation is not necessary. Further, the means for providing the modulation is much simpler than in previous systems wherein the modulation was obtained through circuit action rather than through direct mechanical action on the crystal itself. This results in smaller and less expensive modulated oscillator structures which require less power for operation than in prior systems.

It is obvious that by controlling a static bias on the crystal the center frequency can be controlled and that by then adding dynamic variation modulation of the crystal frequency takes place. This may be directly utilized in an oscillator circuit to provide frequency modulation as used in radio transmission. As such transmitters can be very compact, and require a small amount of power, they are ideally suited for mobile applications.

Although certain embodiments of the invention have been shown which are illustrative thereof, it is obvious that various changes and modifications can be made therein within the intended scope of the invention as defined in the appended claims.

We claim:

1. A crystal structure including a piezo-electric crystal for controlling oscillations of a relatively high frequency, ceramic crystal means adapted to respond to low frequency waves and including first and second portions, said crystal structure including first and second interconnected parts with said first part including said piezo-electric crystal and said first portion of said ceramic crystal means, said second part of said crystal structure including said second portion of said ceramic crystal means, and means for applying relatively low frequency electric signal to said ceramic crystal means to cause deformation thereof, with the deformation of said second crystal means causing deformation of said piezo-electric crystal to modulate the frequency of response thereof.

2. A crystal structure including a first piezo-electric crystal for controlling oscillations of a relatively high frequency, ceramic crystal means adapted to respond to low frequency waves and including first and second elongated portions which are oppositely polarized, said crystal structure including first and second parallel extending parts interconnected at the ends thereof, said first part including said first crystal, said first portion of said ceramic crystal means and temperature compensating means, said second part of said crystal structure including said second portion of said ceramic crystal means, said temperature compensating means automatically compensating for changes in dimensions in said first crystal and said ceramic crystal means resulting from changes in temperature, with the deformation of said ceramic crystal means resulting from the application of a low frequency voltage wave thereto causing deformation of said first crystal means to modulate the frequency of response thereof.

3. A crystal structure including a first piezoelectric crystal for controlling oscillations of a relatively high frequency, ceramic crystal means adapted to respond to low frequency waves and including first and second parallel extending elongated portions having one pair of adjacent ends thereof interconnected, means connecting said first crystal between said first and second portions of said ceramic crystal means at the ends thereof opposite said one end, said first and second portions of said ceramic crystal means being oppositely polarized, and means for applying a modulating wave to said ceramic crystal means so that said portions thereof are deformed in opposite sense to provide an additive effect causing large deformation of said first crystal means to modulate the frequency of response thereof.

4. A crystal structure including a first piezoelectric crystal for controlling oscillations of a relatively high frequency, ceramic crystal means adapted to respond to low frequency waves and including first and second parallel extending elongated portions having one pair of adjacent ends thereof interconnected, means connecting said first crystal between said first and second portions of said ceramic crystal means at the ends thereof opposite said one end, said first and second portions of said ceramic crystal means being oppositely polarized, and means for applying a modulating wave to said ceramic crystal means so that said portions thereof are deformed in opposite sense to provide an additive effect causing large deformation of said first crystal means to modulate the frequency of response thereof, said first and second portions of said ceramic crystal means tending to balance out the effect of temperature variations on each other.

5. A crystal structure including a first piezoelectric crystal for controlling oscillations of a relatively high frequency, ceramic crystal means adapted to respond to low frequency waves and including first and second parallel extending elongated portions having one pair of adjacent ends thereof interconnected, means connecting said first crystal between said first and second portions of said ceramic crystal means at the ends thereof opposite said one end, said first and second portions of said ceramic crystal means being oppositely polarized, and means for applying a modulating wave to said ceramic crystal means so that said portions thereof are deformed in opposite sense to provide an additive effect causing large deformation of said first crystal means to modulate the frequency of response thereof, said first and second portions of said ceramic crystal means tending to balance out the effect of temperature variations on each other, said connecting means including a temperature compensating portion for automatically compensating for changes in said first crystal and said ceramic crystal means resulting from changes in temperature.

6. A crystal structure including a first piezoelectric crystal for controlling oscillations of a relatively high frequency, ceramic crystal means adapted to respond to low frequency waves and including first, second and third parallel extending elongated portions, said second portion being intermediate said first and third portions with said three portions having adjacent ends thereof interconnected, means connecting said first crystal between the end of said second portion opposite said interconnected end and the ends of said first and third portions opposite said interconnected ends thereof, said first and third portions of said ceramic crystal means being oppositely polarized with respect to said second portion, means for applying a modulating wave to said ceramic crystal means so that said second portion thereof is deformed in opposite sense to said first and third portions thereof to provide an additive effect causing large deformation of said first crystal means to modulate the frequency of response thereof.

7. A crystal structure including a first piezoelectric crystal for controlling oscillations of a relatively high frequency, ceramic crystal means adapted to respond to low frequency waves and including first, second and third parallel extending elongated portions, said second portion being intermediate said first and third portions with said three portions having adjacent ends thereof interconnected, means connecting said first crystal between the end of said second portion opposite said interconnected end and the ends of said first and third portions opposite said interconnected ends thereof, said first and third portions of said ceramic crystal means being oppositely polarized with respect to said second portion, means for applying a modulating wave to said ceramic crystal means so that said second portion thereof is deformed in opposite sense to said first and third portions thereof to provide an additive effect causing large deformation of said first crystal means to modulate the frequency of response thereof, said connecting means including a portion having a temperature coefficient of expansion such that changes in the dimension of said first crystal and said ceramic crystal means resulting from changes in temperature are balanced out.

8. A frequency modulation system including in combination an oscillator circuit including a piezo-electric crystal unit for controlling the frequency thereof, said crystal unit including a flat crystal plate having a natural resonant frequency and having an axis in the plane of said plate the length of which may be changed to change the resonant frequency of said crystal plate, said crystal unit including supporting means for said crystal plate for securing the same at one end of the axis thereof, and electromechanical means responsive to modulating signals having a portion mechanically connected to said crystal plate at the end of said axis opposite to said one end for applying mechanical forces to said flat plate to change the length of said axis thereof so that the frequency response of said crystal plate is changed to thereby modulate the frequency of said oscillator circuit, said electromechanical means being coupled to said oscillator circuit only through the mechanical connection to said crystal plate.

9. A frequency modulation system in accordance with claim 8 wherein said electromechanical means includes a modulating piezo-electric crystal device responsive to modulating signals and engaging said crystal unit at said opposite end of said axis thereof to cause compression and expansion thereof.

10. A modulating system in accordance with claim 8 wherein said electromechanical means includes a moving coil mechanically coupled to said piezo-electric crystal, and means for applying modulating signals to said moving coil to cause movement thereof in accordance with the amplitude of the modulating signals to change the length of said axis of said crystal plate and thereby modulate the frequency of said oscillator.

11. A frequency modulation system in accordance with claim 8 wherein said electromechanical means include a plunger portion mechanically coupled to said piezo-electric crystal, coil means about said plunger portion adapted to provide fields for moving the same, and means for applying modulating signals to said coil means to cause movement of said plunger portion corresponding to the amplitude of the applied modulating signals, with said plunger portion changing the length of said axis of said crystal plate to change the resonant frequency thereof and thereby modulate the frequency of said oscillator.

12. A frequency modulation system in accordance with claim 8 wherein said electromechanical means include a plunger portion mechanically coupled to said piezo-electric crystal, first and second coil means about said plunger portion adapted to provide fields for moving said plunger in opposite directions, and means for applying modulating signals to said coil means including first rectifier means for applying signals of one polarity to said first coil means for moving said plunger in one direction, and second rectifier means for applying signals of opposite polarity to said second coil means for moving said plunger in the opposite direction, said plunger portion compressing and stretching said crystal plate along said axis thereof to change the resonant frequency of said plate and thereby modulate the frequency of said oscillator.

13. A frequency modulation system in accordance with claim 8 wherein said electromechanical means includes a first portion engaging said piezo-electric crystal at said other end of said axis and a second portion engaging said piezo-electric crystal along a line angularly disposed with respect to said axis, and means including rectifier means for applying modulating signals to said electromechanical means for causing movement of said first portion in response to signals of one polarity and for causing movement of said second portion in response to signals of the opposite polarity, whereby action of said first portion compresses said crystal along said axis to change the frequency in one direction from the natural resonant frequency and operation of said second portion compresses the crystal along a different axis to change the frequency in the opposite direction from the natural resonant frequency.

14. A frequency modulation system including in combination, an oscillator circuit including a piezo-electric crystal unit, said crystal unit including a flat crystal plate having a natural resonant frequency and having an axis in the plane of said plate the length of which may be changed to change the resonant frequency of said crystal plate, with decrease and increase of the length of said axis produced by compression and stretching respectively of said crystal plate causing variations in the resonant frequency thereof having opposite senses, said crystal unit including supporting means rigidly secured to said crystal plate at points thereon adjacent the ends of said axis thereof, and electromechanical means responsive to modulating signals having a portion connected to said supporting means for applying mechanical forces to said crystal plate to compress and stretch the same and thereby change the length of said axis thereof, so that the resonant frequency of said crystal plate is varied in opposite senses from its normal value, said oscillator circuit providing oscillations the frequency of which are controlled by the resonant frequency of said crystal unit so that the frequency of said oscillator circuit is modulated by the variation in the resonant frequency of said crystal plate, said electromechanical means being connected to said oscillator circuit only through the mechanical connection to said supporting means.

References Cited in the file of this patent

UNITED STATES PATENTS

| | | |
|---|---|---|
| 1,636,921 | Nicolson | July 26, 1927 |
| 1,769,360 | Thomas | July 1, 1930 |
| 1,796,116 | Nicholson | Mar. 10, 1931 |
| 1,841,459 | Taylor | Jan. 19, 1932 |
| 1,994,228 | Osnos | Mar. 12, 1935 |
| 2,473,610 | Rieber | June 21, 1949 |